(12) United States Patent
Leatherdale et al.

(10) Patent No.: US 7,423,297 B2
(45) Date of Patent: Sep. 9, 2008

(54) LED EXTRACTOR COMPOSED OF HIGH INDEX GLASS

(75) Inventors: Catherine A. Leatherdale, St. Paul, MN (US); Anatoly Z. Rosenflanz, Maplewood, MN (US); Kenton D. Budd, Woodbury, MN (US); Amy S. Barnes, St. Paul, MN (US); Andrew J. Ouderkirk, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 11/381,518

(22) Filed: May 3, 2006

(65) Prior Publication Data

US 2007/0257267 A1  Nov. 8, 2007

(51) Int. Cl.
*H01L 31/0232* (2006.01)

(52) U.S. Cl. .................. 257/98; 257/99; 257/E33.055; 257/E33.067; 257/33.071

(58) Field of Classification Search .................. 257/79, 257/40, 90, 95, E33.073, E33.067, E33.068, 257/98, E33.055, E33.071
See application file for complete search history.

(56) References Cited

U.S. PATENT DOCUMENTS

| | | | |
|---|---|---|---|
| 2,150,694 A | 3/1939 | Morey | |
| 3,596,136 A * | 7/1971 | Fischer | 257/794 |
| 3,834,883 A | 9/1974 | Klein | |
| 4,590,128 A * | 5/1986 | Kawai | 428/411.1 |
| 5,222,795 A * | 6/1993 | Hed | 362/558 |
| 5,403,773 A | 4/1995 | Nitta | |
| 5,689,374 A | 11/1997 | Xu et al. | |
| 6,156,243 A * | 12/2000 | Kosuga et al. | 264/2.5 |
| 6,254,981 B1 | 7/2001 | Castle | |
| 6,473,554 B1 * | 10/2002 | Pelka et al. | 385/146 |
| 6,597,834 B1 * | 7/2003 | Hata | 385/31 |
| 6,627,328 B2 * | 9/2003 | Kanamaru et al. | 428/620 |
| 6,870,311 B2 | 3/2005 | Mueller et al. | |
| 7,009,213 B2 | 3/2006 | Camras et al. | |
| 2002/0030194 A1 | 3/2002 | Camras et al. | |
| 2003/0126803 A1 * | 7/2003 | Rosenflanz | 51/307 |
| 2004/0046179 A1 * | 3/2004 | Baur et al. | 257/98 |
| 2004/0072383 A1 * | 4/2004 | Nagahama et al. | 438/47 |
| 2004/0099868 A1 * | 5/2004 | Silverbrook | 257/79 |

(Continued)

FOREIGN PATENT DOCUMENTS

EP   0 905 099   3/1999

(Continued)

OTHER PUBLICATIONS

Lakiza et al., Triangulation and Liquidus Surface in the Al2O3—ZrO2—La2O3 Phase Diagram, Powder Metallurgy and Metal Ceramics, vol. 41, 627-636, 2002.*

(Continued)

*Primary Examiner*—Matthew C. Landau
*Assistant Examiner*—Minchul Yang
(74) *Attorney, Agent, or Firm*—Elizabeth A. Gallo

(57) ABSTRACT

An LED extractor has an input surface adapted to optically couple to an emitting surface of an LED die, and is composed of a glass (including a glass-ceramic) material whose refractive index is at least 2, or at least 2.2.

19 Claims, 5 Drawing Sheets

U.S. PATENT DOCUMENTS

| | | | |
|---|---|---|---|
| 2004/0148967 A1 | 8/2004 | Celikkaya et al. | |
| 2004/0166362 A1* | 8/2004 | Utsumi et al. | 428/690 |
| 2004/0183086 A1* | 9/2004 | Nakai | 257/98 |
| 2004/0213539 A1 | 10/2004 | Anderson et al. | |
| 2004/0247875 A1* | 12/2004 | Ootsuka et al. | 428/411.1 |
| 2004/0264185 A1 | 12/2004 | Grotsch et al. | |
| 2005/0023545 A1* | 2/2005 | Camras et al. | 257/98 |
| 2005/0035363 A1* | 2/2005 | Okazaki et al. | 257/98 |
| 2005/0045896 A1* | 3/2005 | Goh et al. | 257/98 |
| 2005/0065012 A1 | 3/2005 | Rosenflanz et al. | |
| 2005/0065013 A1 | 3/2005 | Rosenflanz | |
| 2005/0137076 A1 | 6/2005 | Rosenflanz | |
| 2005/0243570 A1 | 11/2005 | Chaves et al. | |
| 2005/0272589 A1* | 12/2005 | Shimizu | 501/54 |
| 2005/0274145 A1 | 12/2005 | Aitken et al. | |
| 2006/0006408 A1* | 1/2006 | Suehiro et al. | 257/103 |
| 2006/0049421 A1 | 3/2006 | Suehiro et al. | |
| 2006/0091411 A1 | 5/2006 | Ouderkirk et al. | |
| 2006/0091414 A1 | 5/2006 | Ouderkirk et al. | |
| 2006/0091784 A1* | 5/2006 | Conner et al. | 313/498 |
| 2006/0091798 A1 | 5/2006 | Ouderkirk et al. | |
| 2006/0092532 A1* | 5/2006 | Ouderkirk et al. | 359/819 |
| 2006/0094340 A1 | 5/2006 | Ouderkirk et al. | |
| 2006/0128118 A1* | 6/2006 | Nagahama et al. | 438/458 |
| 2006/0261364 A1* | 11/2006 | Suehiro et al. | 257/100 |
| 2007/0064417 A1 | 3/2007 | Hatanaka et al. | |

FOREIGN PATENT DOCUMENTS

| | | |
|---|---|---|
| JP | 10223367 | 8/1998 |
| JP | 2005-183005 | 7/2005 |
| WO | WO 93/21120 | 10/1993 |
| WO | WO 03/011776 | 2/2003 |
| WO | WO 3011776 A1 * | 2/2003 |
| WO | WO 03/023458 | 3/2003 |
| WO | WO 2003/073525 | 9/2003 |

OTHER PUBLICATIONS

Kim et al., Fabrication and properties of transparent glass-ceramics in Na2ONb2O5-TeO2 system, Journal of Materials Science Letters, 17, (1998) 1149-1151.*

Rosenflanz et al., *Nature* 430 (Aug. 12, 2004), pp. 761-764 and supplementary info.

Shishido et al., "Ln-M-O glasses obtained by rapid quenching using a laser beam", *Journal of Materials Science*, vol. 13, p. 1006-1014, Chapman and Hall Ltd., 1978.

Tatsumisago et al., "Infrared Spectra of Rapidly Quenched Glasses in the Systems Li2O-RO-Nb2O5 (R=Ba, Ca, Mg)", *Journal of American Ceramic Society*, vol. 2, No. 66, p. 117-119, 1983.

Topol et al., "Formation of New Lanthanide Oxide Glasses by Laser Spin Melting and Free-Fall Cooling", *Journal of Non-Crystalline Solids*, vol. 15, p. 116-124, North-Holland Publishing Company, 1974.

Topol et al., "Formation of New Oxide Glasses by Laser Spin Melting and Free Fall Cooling", *Journal of Non-Crystalline Solids*, vol. 12, p. 377-390, North-Holland Publishing Company, 1973.

U.S. Appl. entitled "Method of Making Ceramic Articles", filed on Aug. 2, 2001, having U.S. Appl. No. 09/922,526.

U.S. Appl. entitled "Al2O3-Rare Earth Oxide-ZrO2/HfO2 Materials, and Methods of Making and Using the Same", filed on Aug. 2, 2001, having U.S. Appl. No. 09/922,527.

U.S. Appl. entitled "Method of Making Ceramic Articles", filed Aug. 8, 2002, having U.S. Appl. No. 10/211,491.

U.S. Appl. entitled "LED Package with Converging Optical Element", filed May 2, 2006, having U.S. Appl. No. 11/381,324.

U.S. Appl. entitled "Arrays of Light Emitting Articles and Method of Manufacturing Same", filed Nov. 22, 2005, having U.S. Appl. No. 60/738,896.

U.S. Appl. entitled "Method of Reshaping a Glass Body", filed May 3, 2006, having U.S. Appl. No. 60/797,847.

U.S. Appl. entitled "Arrays of Optical Elements and Method of Manufacturing Same", filed Nov. 22, 2005, having U.S. Appl. No. 11/288,071.

U.S. Appl. entitled "Pavement Marking, Reflective Elements, and Methods of Making Microspheres", filed on Nov. 14, 2005, having U.S. Appl. No. 11/273,513.

U.S. Appl. entitled "Methods of Making LED Extractor Arrays", filed on May 3, 2005, having U.S. Appl. No. 11/381,512.

U.S. Appl. entitled "Ceramics Comprising Al2O3, REO, ZrO2 and/or HfO2, and Nb2O5 and/or Ta2O5 and Methods of Making the Same", filed Sep. 25, 2006, having U.S. Appl. No. 10/666,212.

Yamaguchi T., "Refractive Index Measurement of High Refractive Index Glass Beads", *Applied Optics*, vol. 14, No. 5, p. 1111-1115, May 1975.

* cited by examiner

| Glass Sample | Reference | Example | Al2O3 (wt%) | La2O3 (wt%) | ZrO2 (wt%) | TiO2 (wt%) | Er2O3 (wt%) | Ta2O5 (wt%) | Nb2O5 (wt%) | Gd2O3 (wt.%) | CaO (wt.%) | BaO (wt.%) | Tg | Tx | n1 | n2 |
|---|---|---|---|---|---|---|---|---|---|---|---|---|---|---|---|---|
| 1 | US2003/0126803 | 7 | 34.98 | 45.06 | 19.96 | | | | | | | | 837 | 936 | 1.86 | |
| 2 | | 8 | 38.98 | 42.29 | 8.73 | | | | | | | | 831 | 935 | 1.85 | |
| 3 | | 9 | 39.51 | 42.98 | 17.51 | | | | | | | | 843 | 928 | 1.82 | |
| 4 | | 10 | 46.98 | 36.74 | 16.28 | | | | | | | | 848 | 920 | 1.83 | |
| 5 | | 11 | 38.73 | 38.65 | 22.62 | | | | | | | | 850 | 923 | 1.83 | |
| 6 | | 12 | 40.23 | 40.15 | 19.62 | | | | | | | | 849 | 930 | 1.82 | |
| 7 | | 13 | 43.23 | 43.15 | 13.62 | | | | | | | | 843 | 932 | 1.8 | |
| 8 | | 14 | 48.98 | 35.35 | 15.66 | | | | | | | | 856 | 918 | 1.79 | |
| 9 | | 15 | 52.98 | 32.58 | 14.44 | | | | | | | | 858 | 914 | 1.76 | |
| 10 | | 16 | 54.98 | 31.2 | 13.82 | | | | | | | | 859 | 914 | 1.75 | |
| 11 | | 17 | 58.98 | 28.43 | 12.59 | | | | | | | | 862 | 912 | 1.74 | |
| 12 | | 18 | 55.33 | 26.67 | 18.00 | | | | | | | | 875 | 908 | 1.78 | |
| 13 | | 19 | 8.5 | 86.5 | 5 | | | | | | | | | | 1.95 | |
| 14 | | 20 | 8.1 | 81.9 | 10 | | | | | | | | | | 2.01 | |
| 15 | | 36 | 36.5 | 43.02 | 17.46 | | | | | | | | 836 | 934 | 1.853 | |
| 16 | WO 03/011776 | 3 | | 45 | | 3 | | | | | | | 799 | 875 | 2.35 | |
| 17 | | 4 | | 36 | 20 | 55 | | | | | | | 821 | 876 | 2.32 | |
| 18 | | 7 | 40.98 | 40.9 | 18.12 | 44 | | | | | | | 839 | 932 | 1.82 | |
| 19 | US2005/0065013 | 7 | 5.71 | 14.51 | | | 1.02 | 78.75 | | | | | 842 | 942 | 2.15 | |
| 20 | | 9 | 5.08 | 18.14 | | | 1 | 75.78 | | | | | 875 | 979.9 | 2.18 | |
| 21 | | 11 | 29.68 | 27.56 | | | 1 | 41.77 | | | | | 840 | 934 | 2.14 | |
| 22 | | 13 | | 57.38 | 11.68 | | 1 | 29.94 | | | | | | | 2.22 | |
| 23 | | 16 | | 65.23 | 13.28 | | 1 | | 20.47 | | | | | | 2.16 | |
| 24 | | 17 | | 25.87 | 9.78 | | 1 | | 63.33 | | | | | | 2.28 | |
| 25 | | 18 | | 17.92 | 24.64 | | 1 | | 58.48 | | | | | | 2.32 | |
| 26 | | 19 | 34.24 | | 27.58 | | 1 | | 37.18 | | | | | | 1.95 | |
| 27 | | 20 | 9.87 | | 11.92 | | 1 | | 77.19 | | | | | | 2.24 | |
| 28 | | 21 | 8.22 | | 26.49 | | 1 | | 64.28 | | | | | | 2.21 | |

Fig. 11A

| Glass Sample | Reference | Example | Al2O3 (wt%) | La2O3 (wt%) | ZrO2 (wt%) | TiO2 (wt%) | Er2O3 (wt%) | Ta2O5 (wt%) | Nb2O5 (wt%) | Gd2O3 (wt%) | CaO (wt.%) | BaO (wt.%) | Tg | Tx | n1 | n2 |
|---|---|---|---|---|---|---|---|---|---|---|---|---|---|---|---|---|
| 29 | USSN 11/273,513 | 22 | 27.41 | | 22.08 | | 1 | | 49.49 | | | | | | 2.1 | 2.48 |
| 30 | | 24 | 5.74 | | 18.52 | | 1 | | 74.72 | | | | | | 2.15 | 2.44 |
| 31 | | 2 | | 25.9 | 6.5 | 67.6 | | | | | | | | | 2.39 | 2.44 |
| 32 | | 3 | | 33.8 | | 66.2 | | | | | | | | | 2.37 | 2.43 |
| 33 | | 5 | | 25.3 | 12.7 | 62.0 | | | | | | | | | 2.40 | 2.34 |
| 34 | | 6 | | 33.0 | 6.2 | 60.8 | | | | | | | | | 2.39 | 2.41 |
| 35 | | 7 | | 40.5 | | 59.5 | | | | | | | | | 2.35 | 2.35 |
| 36 | | 8 | | 24.7 | 18.7 | 56.6 | | | | | | | | | 2.36 | 2.34 |
| 37 | | 9 | | 32.3 | 12.2 | 55.5 | | | | | | | | | 2.34 | 2.32 |
| 38 | | 10 | | 39.6 | 6.0 | 54.4 | | | | | | | | | 2.34 | 2.33 |
| 39 | | 11 | | 46.6 | | 53.4 | | | | | | | | | 2.31 | 2.32 |
| 40 | | 12 | | 31.6 | 17.9 | 50.5 | | | | | | | | | 2.33 | 2.31 |
| 41 | | 13 | | 38.8 | 11.7 | 49.5 | | | | | | | | | 2.31 | 2.35 |
| 42 | | 14 | | 45.7 | 5.8 | 48.5 | | | | | | | | | 2.28 | 2.37 |
| 43 | | 15 | | 16.8 | 25.4 | 57.8 | | | | | | | | | -- | 2.37 |
| 44 | | 16 | | 24.2 | 24.4 | 51.4 | | | | | | | | | 2.33 | 2.39 |
| 45 | | 17 | | 12.7 | 12.8 | 62.5 | | | | | | | | | 2.33 | 2.38 |
| 46 | | 18 | | 16.7 | 6.3 | 61.3 | | | | | | | | | 2.33 | 2.42 |
| 47 | | 19 | | 12.5 | 18.8 | 57.0 | | | | | | | | | 2.31 | 2.39 |
| 48 | | 20 | 2.0 | 24.8 | 12.4 | 60.8 | | | | | | | | | 2.34 | 2.44 |
| 49 | | 21 | 2.0 | 32.4 | 6.1 | 59.5 | | | | | | | | | 2.31 | 2.43 |
| 50 | | 22 | 2.0 | 28.6 | 9.3 | 60.1 | | | | | | | | | 2.34 | 2.42 |
| 51 | | 23 | 2.0 | 27.5 | 8.3 | 62.2 | | | | | | | | | 2.33 | |
| 52 | | 24 | | | 15.0 | 60.0 | | | | 25.0 | | | | | 2.32 | |
| 53 | (none) | | | | 10 | | | | 75 | | 15 | | | | 2.2 | |
| 54 | (none) | | | | 10 | | | | 76 | | 14 | | 575 | 600 | 2.18 | |
| 55 | (none) | | | | | | | | 83 | | 15 | 17 | 544 | 630 | 2.17 | |
| 56 | (none) | | | | | | | | 85 | | | | | | 2.14 | |

*Fig. 11B*

LED EXTRACTOR COMPOSED OF HIGH INDEX GLASS

FIELD OF THE INVENTION

The present invention relates generally to light emitting diodes (LEDs), and in particular to optical components or elements used to extract light generated within an LED die.

BACKGROUND

LEDs are a desirable choice of light source in part because of their relatively small size, low power/current requirements, rapid response time, long life, robust packaging, variety of available output wavelengths, and compatibility with modern circuit construction. These characteristics may help explain their widespread use over the past few decades in a multitude of different end use applications. Improvements to LEDs continue to be made in the areas of efficiency, brightness, and output wavelength, further enlarging the scope of potential end-use applications.

LEDs are typically sold in a packaged form that includes an LED die or chip mounted on a metal header. The header can have a reflective cup in which the LED die is mounted, and electrical leads connected to the LED die. Some packages also include a molded transparent resin that encapsulates the LED die. The encapsulating resin can have either a nominally hemispherical front surface to partially collimate light emitted from the die, or a nominally flat surface. Other materials besides resins have been proposed for the encapsulating body, referred to herein as an encapsulant. For example, U.S. Pat. No. 3,596,136 (Fischer) discusses LEDs having domes made of certain glasses, glasses comprising by weight 19 to 41% arsenic, 10 to 25% bromine, and either 28 to 50% sulfur or 65 to 70% selenium. Fischer reports at least one glass that is yellow in color with a refractive index of about 2.4, another glass that is red in color with a refractive index between 2.5 and 2.7, and still another glass that is black in color with a refractive index of about 2.9.

It is also known to utilize an optical element that is made separately and then brought into contact or close proximity with a surface of an LED die to couple or "extract" light therefrom and reduce the amount of light trapped within the die. Such an element is referred to herein as an extractor. Extractors normally have an input surface sized and shaped to substantially mate with a major emitting surface of the LED die.

LEDs generate light within high refractive index semiconductor materials that make up the die of the LED. If the die is immersed in air, the large refractive index mismatch between the semiconductor and air causes much of the light propagating within the die to be totally internally reflected at the die/air interface. Only light traveling at angles within a relatively narrow escape cone associated with the interface can refract into the air and escape the die. The half-angle of the escape cone is the well-known critical angle for the interface. As a result, much of the light generated by the die is wasted, and the achievable brightness of the LED suffers.

Both encapsulants and extractors can be used to reduce the amount of wasted light and improve brightness. They do this by providing a light-transmissive material at the surface of the LED die whose refractive index (n) is closer to that of the die than air, reducing the refractive index mismatch at the interface and increasing the span of the escape cone. The closer n is to the refractive index of the die, the less light is wasted inside the die, and the brighter the LED can shine.

From a practical standpoint, conventional encapsulants have been successful to only a limited extent in this regard. The encapsulant substantially surrounds the die, and because of this and the large temperature shifts from the heat generated at the die, the encapsulant material is selected not only for its refractive index properties but also for its thermal and mechanical properties to avoid damaging the LED die over many temperature cycles, and for its ability to resist yellowing or other degradation when exposed to the high flux emitted by the die. As a result, most encapsulated LEDs utilize specialized epoxy resins that have a refractive index n of only about 1.4 to 1.6. These values are well above the refractive index of air (n=1), but well below that of most LED dies (n≈2.3 or higher). Thus, there is still room for substantial improvement.

Extractors are currently not as widely used in LEDs as encapsulants, possibly due to additional manufacturing steps needed to first fabricate the extractor and then hold it in position at the LED die, and the associated expense and complexity. Some workers have proposed using a bonding layer to bond the extractor to a surface of the LED. See, e.g., U.S. Patent Application Publication 2005/0023545 (Camras et al.). These workers suggest forming the extractor from the following materials: SiC (reported refractive index ~2.7 at 500 nm), aluminum oxide (sapphire, reported refractive index ~1.8 at 500 nm), diamond (reported refractive index ~2.4 at 500 nm), cubic zirconia ($ZrO_2$), aluminum oxynitride (AlON) by Sienna Technologies Inc., polycrystalline aluminum oxide (transparent alumina), spinel, Schott glass LaFN21, Schott glass LaSFN35, LaF2, LaF3, and LaF10 available from Optimax Systems Inc. of Ontario, N.Y. Some other materials are also alluded to. The materials are believed to fall generally within two classes: glass materials of moderate refractive index (1.5<n<2), and crystalline materials of higher refractive index, for example, diamond and silicon carbide, whose refractive indices are well above 2).

BRIEF SUMMARY

The present application discloses, inter alia, a class of materials that has been found to fill an important gap in the manufacture of extractors for LEDs. These materials have high refractive indices (n≧2 or 2.1 or 2.2 or 2.3 or 2.4 at emission wavelengths of the LED), similar to known crystalline materials. But unlike crystalline materials, the disclosed materials are at least initially amorphous glasses. Hence, they exhibit a distinct glass transition temperature $T_g$ and crystallization temperatures $T_x$, and they can be readily deformed into the shape of an extractor or an array of extractors for subsequent mating with an LED die or array of LED dies. Preferably such deformation can be done at temperatures below 1000° C. If desired, the materials can be subjected to a heat treatment, preferably after deforming them in the shape of one or more extractors, such that the glass material is converted to a material that is partially or completely crystalline, referred to as a glass-ceramic material.

The disclosed materials preferably include at least two different metal oxides, and small amounts of conventional glass formers, e.g., less than 20 (or 15, 10, 5, 3, 2, or 1) percent by weight $SiO_2$, less than 20 (or 15, 10, 5, 3, 2, or 1) percent by weight $B_2O_3$, and less than 40 (or 30, 20, 10, 5, 3, 2, or 1) percent by weight $P_2O_5$. In some cases the materials include less than 20 (or 10, 8, 5, 3, 2, or 1) percent by weight of the entire group of compounds $As_2O_3$, $Bi_2O_3$, $GeO_2$, NaO, $TeO_2$, $V_2O_5$, $SiO_2$, $B_2O_3$, and $P_2O_5$, based on the total weight of the glass body perform. Preferably, $T_g$ and $T_x$ are separated by at least 5° C., i.e., $T_x \geq T_g + 5°$ C.

Extractors made from these materials can have a wide variety of shapes and sizes, but they preferably include at least an input surface adapted to mate with a surface of an LED die. For example, if the LED die has a rectangular output surface, the input surface of the extractor can also have a rectangular shape, the length and width of which can be similar to that of the LED die surface, e.g., substantially the same as or differing by no more than ±10% or ±20% thereof. In cases where the die has a major emitting surface that is flat, the input surface of the extractor is then also flat. Other surfaces of the extractor can be provided so as to redirect the extracted light as desired. For example, the extractor can include an output surface and a side surface connecting the input and output surfaces. The output surface may be larger than the input surface, and the side surface angled or tapered in order to at least partially collimate the LED light along an axis such as a symmetry axis of the LED. In other cases the output surface, or a side surface if present, can be angled to direct the light in a sideways direction.

These and other aspects of the present application will be apparent from the detailed description below. In no event, however, should the above summaries be construed as limitations on the claimed subject matter, which subject matter is defined solely by the attached claims, as may be amended during prosecution.

BRIEF DESCRIPTION OF THE DRAWINGS

Throughout the specification, reference is made to the appended drawings, where like reference numerals designate like elements, and wherein:

FIGS. 11A-B depict a table showing relevant properties of certain glasses, demonstrating that some are capable of exhibiting refractive indices of 2, 2.1, 2.2, 2.3, and 2.4 and higher.

DETAILED DESCRIPTION OF ILLUSTRATIVE EMBODIMENTS

Figure 1:
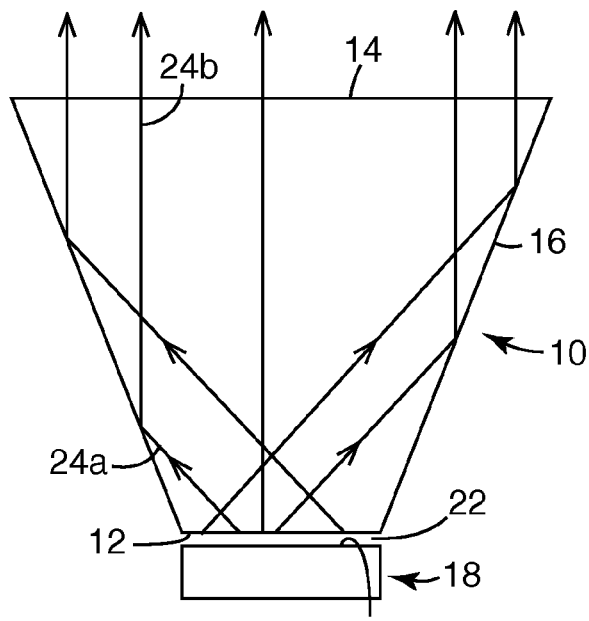
FIG. 1 is a schematic side view of an LED extractor/LED die combination.

The following Description describes light emitting diode (LED) light sources. In this regard, "light emitting diode" or "LED" refers to a diode that emits light, whether visible, ultraviolet, or infrared. It includes incoherent encased or encapsulated semiconductor devices marketed as "LEDs", whether of the conventional or super radiant variety, and whether of the forward-emitting or side-emitting variety, the latter of which is often advantageous in display applications. If the LED emits non-visible light such as ultraviolet light, and in some cases where it emits visible light, it can be packaged to include an organic or inorganic phosphor (or it may illuminate a remotely disposed phosphor) to convert short wavelength light to longer wavelength visible light, in some cases yielding a device that emits white light. An "LED die" is an LED in its most basic form, i.e., in the form of an individual component or chip made by semiconductor processing procedures. For example, the LED die is ordinarily formed from a combination of one or more Group III elements and of one or more Group V elements (III-V semiconductor). Examples of suitable III-V semiconductor materials include nitrides, such as gallium nitride, and phosphides, such as indium gallium phosphide. Other types of III-V materials can be used also, as might inorganic materials from other groups of the periodic table. The component or chip can include electrical contacts suitable for application of power to energize the device. Examples include solder reflow, wire bonding, tape automated bonding (TAB), or flip-chip bonding. The individual layers and other functional elements of the component or chip are typically formed on the wafer scale, and the finished wafer can then be diced into individual piece parts to yield a multiplicity of LED dies. The LED die may be configured for surface mount, chip-on-board, or other known mounting configurations.

Furthermore, for purposes of this application the following terms will have the indicated meanings, unless clearly indicated otherwise:

"amorphous material" refers to material derived from a melt and/or a vapor phase that lacks any long range crystal structure as determined by X-ray diffraction and/or has an exothermic peak corresponding to the crystallization of the amorphous material as determined by a differential thermal analysis (DTA);

"differential thermal analysis" or "DTA" refers to a procedure that involves measuring the difference in temperature between a sample and a thermally inert reference, such as $Al_2O_3$, as the temperature is raised. A graph of the temperature difference as a function of the temperature of the inert reference provides information on exothermic and endothermic reactions taking place in the sample. An exemplary instrument for performing this procedure is available from Netzsch Instruments, Selb, Germany under the trade designation "NETZSCH STA 409 DTA/TGA". A suitable amount, e.g., 400 mg, of a sample can be placed in a suitable inert holder (e.g. a 100 ml $Al_2O_3$ sample holder) and heated in static air at a suitable rate, e.g. 10° C./minute, from an initial temperature (e.g. room temperature, or about 25° C.) to a final temperature, such as 1200° C.

"glass" refers to amorphous inorganic material exhibiting a glass transition temperature;

"glass-ceramic" refers to a material formed by heat-treating glass, the material being partially or completely crystalline;

"$T_g$" refers to the glass transition temperature as determined by a suitable DTA test; and "$T_x$" refers to the crystallization temperature as determined by a suitable DTA test.

We now turn to the figures, initially showing and describing exemplary LED extractors, extractor/die combinations, and arrays thereof. Thereafter, we discuss the preferred high refractive index glass materials.

Extractors

FIG. 1 depicts an LED extractor 10 having an input surface 12, an output surface 14, and a side surface 16. An LED die 18, positioned proximate the input surface 12, emits light from a number of surfaces including a major emitting surface 20. A gap 22 is shown separating the input surface 12 from the emitting surface 20. Whether filled with air or a transparent bonding material or other material, gap 22 is small enough so that the presence of the extractor 10 causes at least some light that would otherwise be totally internally reflected within the LED die 18 to be coupled into the extractor by refraction or frustrated total internal reflection. Typically, the gap 22 is on the order of 100, 50, or 25 nm or less. In other embodiments gap 22 can be substantially eliminated. In either case the input surface 12 is adapted to optically couple to the emitting surface 20 for efficient light transfer from the LED die to the extractor.

For simplicity, LED die 18 is shown generically but can include conventional design features as known in the art. For example, LED die 18 can include distinct p- and n-doped semiconductor layers, buffer layers, substrate layers, and superstrate layers. Although a rectangular LED die arrangement is shown, other known configurations are also contemplated, such as LED dies with angled side surfaces that form a truncated inverted pyramid. Electrical contacts to LED die 18 are not shown for simplicity but can be provided on any of the surfaces of LED die 18 as is known. Preferably, die 18 has a "flip-chip" construction, where electrical contacts are provided on the bottom major surface so that the opposite surface 20 can be made flat without obstructions for convenient mating with input surface 12 of the extractor.

Extractor 10 has an inverted truncated cone shape, but other shapes are also possible. In the schematic view of FIG. 1, side surface 16 can represent a single, tapered surface of revolution, or multiple faceted surfaces that connect input surface 12 to output surface 14. Input surface 12 may be shaped to allow room for electrical contacts that may be present on the emitting surface 20 of the LED die. In many cases, some or substantially all of the emitting surface 20 is flat and polished. In those cases it is also desirable for corresponding portions (including all) of the input surface 12 of the extractor to also be flat and polished, for example, exhibiting a surface roughness less than 50 nm or another specified tolerance. The lateral dimensions and shape of the input surface 12 are also preferably sized to mate with the LED emitting surface, although exact congruence need not be required. To take into account manufacturing tolerances, the extractor input surface may be undersized or oversized relative to the LED emitting surface. For example, the lateral dimensions of the extractor input surface may be as much as 110% or 120%, or as small as 90% or 80%, of the corresponding dimensions of the LED emitting surface. It can also be beneficial to select the dimensions of the extractor such that the maximum lateral dimension of the extractor (whether that occurs at the input surface, the output surface, or an intermediate position) is nominally equal to the corresponding lateral dimension of the LED die. In this approach, described more fully in commonly assigned U.S. application Ser. No. 11/288,071 (Leatherdale et al.), filed Nov. 22, 2005, individual LED/extractor pairs can be cut or diced along the same cut line after bonding a disk or body containing a regular array of extractors to a wafer-scale LED array.

Since extractors are adapted for use with LED dies, and LED dies tend to be no more than a few millimeters in width, the extractors also tend to be relatively small. Without wishing to be limited, extractors commonly have an overall length in a range from 1 to 10, 1 to 5, 1 to 3, or 1 to 2 millimeters, and an overall width in the same range and often smaller than the length.

In operation, light generated within LED die 18 is emitted from emitting surface 20 and passes through gap 22 into extractor 10. Extractor 10 may be bonded to the LED or may be in a non-bonded configuration as described in commonly assigned U.S. application Ser. No. 10/977,249 (Connor et al.), filed Oct. 29, 2004. The materials used in LED die 18 have a high refractive index, which can cause much of the light generated within LED die 18 to undergo total internal reflection at the die surfaces. In order to allow more of this light to escape, emitting surface 20 is optically coupled to input surface 12 of extractor 10. The high refractive index of the material from which extractor 10 is fabricated extracts light from the LED die that would otherwise be lost by total internal reflection. The shape of extractor 10, with input and output surfaces disposed along a central axis of the LED die, where the output surface is wider than the input surface, and with the side surface tapered as shown, at least partially collimates the collected light. FIG. 1 shows a representative obliquely directed ray 24a reflecting at side surface 16 by total internal reflection or otherwise, to produce a reflected ray 24b more closely aligned with the central axis of the LED.

To maximize light extraction efficiency, the refractive index of extractor 10 should closely match the refractive index of emitting surface 20 of LED die 18. But the LED die itself is normally composed of distinct individual layers of different refractive index, for example, epitaxial semiconductor layers disposed on a solid state substrate of SiC, $Al_2O_3$, or another suitable material. In such cases, if the LED die 18 is mounted on a heat sink (not shown) in a face-up configuration, then the emitting surface 20 coincides with an outer surface of one of the semiconductor layers, and the refractive index of the extractor preferably matches the index of the semiconductor. On the other hand if the LED is mounted on the heat sink in a face-down configuration (i.e. epi-down or flip chip), emitting surface 20 coincides with the substrate and the refractive index of the extractor preferably matches the index of the substrate. For $GaN/Al_2O_3$ based high brightness LEDs, the refractive index requirements are between about 1.75 and 2.4. In the case of III-phosphide based semiconductors, the refractive index of the semiconductor layers may be as high as 4.0. As discussed above, high refractive index materials ($n \geq 2$) that have been proposed for use as extractors for LEDs are generally crystalline materials that are difficult to machine or form into the desired small shape, and also costly.

Figure 2:
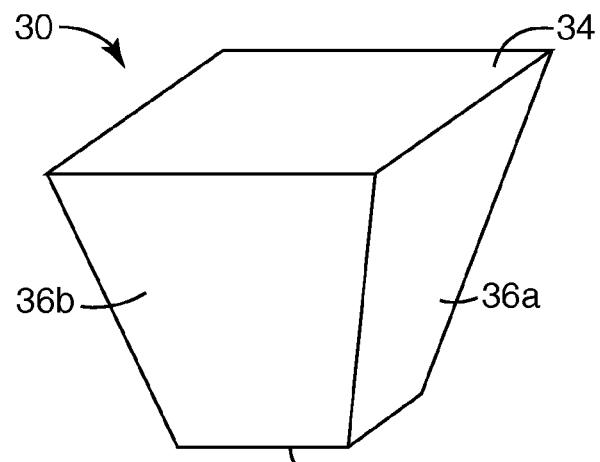
FIGS. 2-9 are schematic views of alternative extractors.

FIG. 2 shows a schematic perspective view of another LED extractor 30. Similar to extractor 10, extractor 30 has an input surface 32 (having similar characteristics to input surface 12), an output surface 34, and at least one side surface. For extractor 30, the side surface is composed of four distinct facets (see surfaces 36a, 36b), one for each side of the polygonal shape of the input and output surfaces. The output surface 34 has greater transverse dimensions than input surface 32, and the side surface is therefore tapered to provide some collimation properties.

Figure 3:
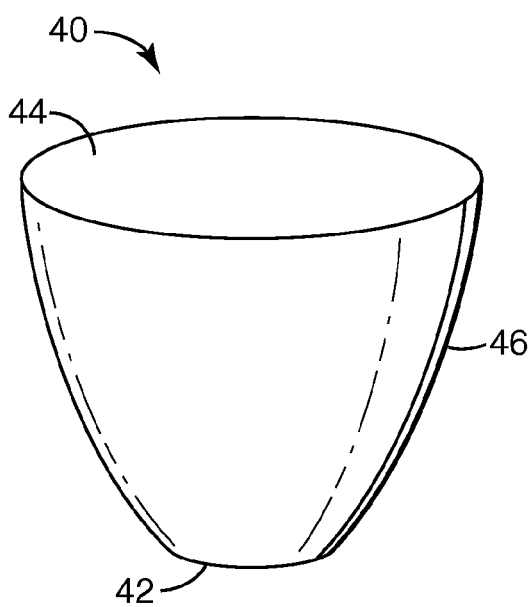

FIG. 3 shows a schematic perspective view of another LED extractor 40, which includes an input surface 42 (having similar characteristics to input surface 12), an output surface 44, and a side surface 46. Extractor 40 is similar to extractor 10, but input and output surfaces 42, 44 are explicitly shown to have a curved rather than a polygonal boundary, and side surface 46 is a continuous surface of revolution. In an exemplary embodiment, side surface 46 is parabolic or paraboloidal in shape. Again, the output surface 44 is larger than the input surface 42, and the side surface 46 is tapered to provide at least partial collimation.

If desired, the orientation of a tapered extractor can be reversed such that the input surface is larger or wider than the output surface. In such cases the extractor can take the form of a pyramid (whether truncated or non-truncated, and whether having a circular, elliptical, or polygonal base) rather than an inverted pyramid coupled to the LED die as depicted in FIG. 1. Light enters the extractor through the surfaces previously referred to as output surfaces 14, 34, 44, and may exit the extractor through the surfaces previously referred to as input surfaces (12, 32, 42) and through the side surfaces 16, 32a-b, 46. Alternatively, the pyramid can be made to terminate at a point (i.e., be non-truncated), eliminating surfaces 12, 32, 42. Further discussion of such extractor configurations is provided in commonly assigned U.S. application Ser. No. 11/381,324 entitled "LED Package With Converging Optical Element", filed May 2, 2006.

Figure 4:
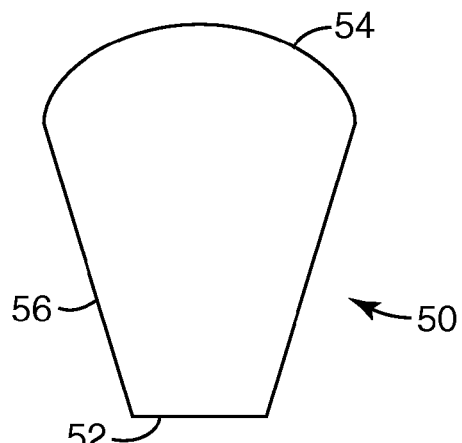

FIG. 4 shows a schematic side view of another extractor 50. Extractor 50 includes an input surface 52 (having similar characteristics to input surface 12), an output surface 54, and a side surface 56. Extractor 50 is again similar to extractor 10, but output surface 54 is curved to control the divergence of emitted light. Like the previous embodiments, extractor 56 can be molded as a unitary optical body.

Figure 5:
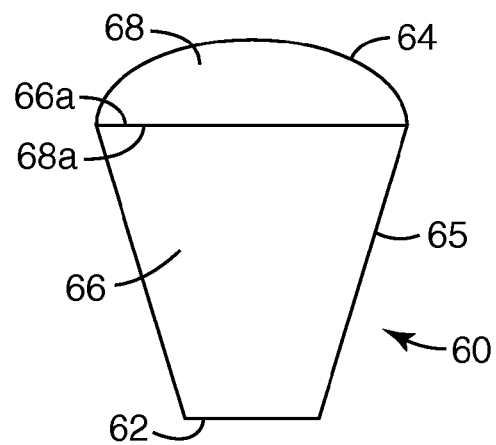

FIG. 5 shows a schematic side view of an extractor 60 similar to that of FIG. 4 and the other figures, but where the extractor 60 has a compound configuration that results from the joining of two distinct light-transmissive bodies or structures. Extractor 60 has an input surface 62, an output surface 64, and a tapered side surface 65. The extractor includes distinct optical bodies 66, 68, bonded or otherwise joined together along mating surfaces 66a, 68a, which are preferably but not necessarily flat. Conventional means such as optical adhesives, low $T_g$ sealing glasses, or reaction bonding can be used for joining. The bodies 66, 68 can be made of the same or different light-transmissive materials having similar or different properties. For example, body 68 may be a commercially available optical glass or even a polymer. Preferably, the portion of the extractor closest to the LED die (and containing the input surface) has a higher refractive index than the other portion or portions of the extractor. Thus, in the case of FIG. 5, optical body 66 is preferably composed of the high refractive index glasses described below, and body 68 can be made of another of the glasses described below, or of commercially available glasses of lower refractive index. The compound construction can also be helpful if a high refractive index optical material, such as one of the high refractive index glasses discussed below, exhibits substantial scattering or absorption, such that it would be impractical to use for the entire extractor. Such a material can be used at the input end of the extractor, having a small enough thickness to keep the scattering or absorption to acceptable levels, and then combined with a lower scattering or lower absorption material to complete the extractor. Further discussion of compound extractors for LEDs is provided in commonly assigned U.S. application Ser. No. 10/977,225 (Ouderkirk et al.), filed Oct. 29, 2004.

Figure 6:
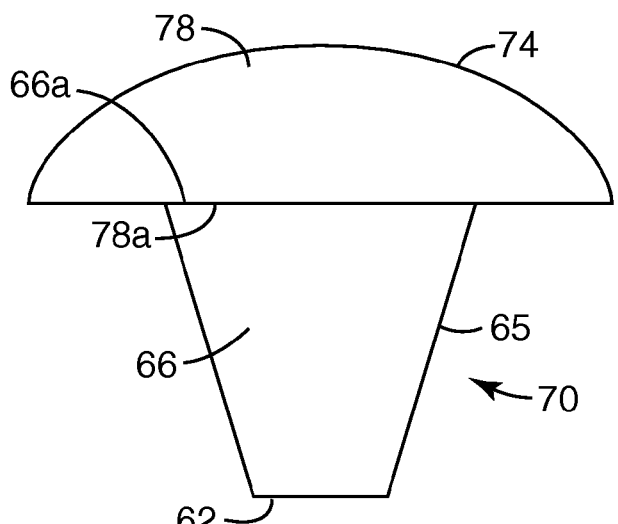

FIG. 6 shows a schematic side view of an extractor 70 similar to extractor 60, but where optical body 68 is replaced with a wider lens or body 78, whose outer surface 74 becomes the output surface of the extractor, and whose other surface 78a is joined to surface 66a of body 66. The edges of surface 66a are recessed from the edges of surface 78a.

Figure 7:
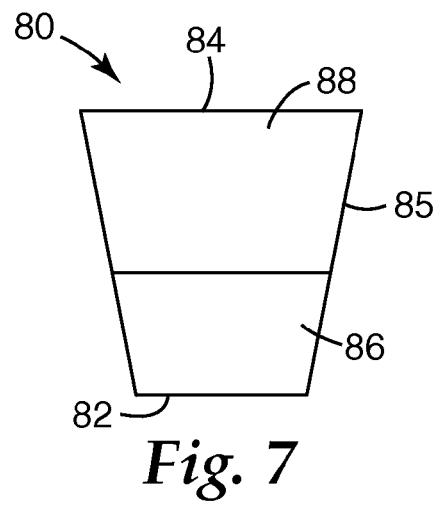

FIG. 7 is a side schematic view of another extractor 80. Like extractors 60 and 70, extractor 80 has a compound construction. Extractor 80 includes optical bodies 86, 88 joined together along an interface. Extractor 80 has an input surface 82, an output surface 84, and a side surface 85, but the roles of these surfaces can be changed as described above, depending on which surface is selected (and adapted) to optically couple or mate with the emitting surface of the LED die. Preferably, one of the high refractive index glasses discussed below is used for the optical body at the input end of the extractor, and a lower refractive index (conventional) glass-forming material such as a silicate is used for the optical body at the output end of the extractor. The relative sizes or thicknesses of optical bodies 86, 88 can be selected depending on the optical, mechanical, and thermal properties of the respective optical materials to produce an extractor with acceptable optical, mechanical, and thermal characteristics.

Alternatively, one of the optical bodies of the compound extractor (e.g. one at the input end thereof) can comprise a transparent, high refractive index material with high thermal conductivity, such as diamond, sapphire, or silicon carbide. Another optical body of the compound extractor (e.g. one at the output end thereof) can comprise one of the high refractive index glass materials discussed below. Such an embodiment may be used to efficiently couple both heat and light from the LED die.

Figure 8:
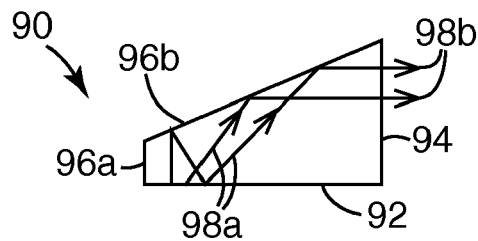
Figure 9:
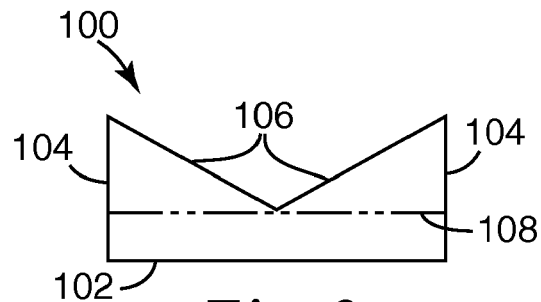

FIGS. 8 and 9 illustrate extractors whose surfaces are arranged to redirect light from the LED in a predominately sideways direction, rather than in a forward direction along a central axis of the LED die. Side-emitting LEDs are particularly suited for use in thin direct-lit backlights for liquid crystal display panels, since the light can be made to spread out laterally over a short distance, avoiding bright and dark areas or hot spots across the viewing area of the display.

FIG. 8 is a schematic side view of a wedge-shaped extractor 90. Extractor 90 has an input surface 92, an output surface 94, and side surfaces 96a, 96b. Although the input and output surfaces of the previously depicted extractors can but need not precisely parallel to each other, in extractor 90 the input and output surfaces 92, 94 are disposed at a substantial angle to each other, nominally about 90 degrees.

With that arrangement, light rays 98a entering through input surface 92 reflect off of one or both of side surfaces 96b, 96a (whether by total internal reflection or with the aid of a reflective material or coating, not shown) and are redirected approximately sideways as represented by light rays 98b. Light rays 98b subsequently exit through output surface 94. The shape or perimeter of extractor 90 from a top view may take any of a variety of forms including rectangular, trapezoidal, pie-shaped, semicircular or any combination thereof.

FIG. 9 is a schematic side view of another wedge-shaped extractor 100. Extractor 100 has an input surface 102, an output surface 104, and side surfaces 106. The extractor 100 can have the shape of extractor 90 rotated about a vertical axis coincident with side surface 96a. In some cases, the extractor can be made by joining two of the extractors 90 at their respective side surfaces 96a in a compound construction. In a different compound construction, phantom line 108 represents a possible interface or boundary between distinct optical bodies making up the extractor 100.

Similar to extractor 90, the input and output surfaces 102, 104 of extractor 100 are disposed at a substantial angle to each other, nominally about 90 degrees. Light from the LED entering input surface 102 reflects off side surface 106 (whether by total internal reflection or with the aid of a reflective material or coating, not shown) and are redirected approximately sideways, subsequently exiting through output surface 104. From a top view (not shown), extractor 100 can have any of a number of shapes including, for example, polygonal (e.g. square or rectangular), circular, and elliptical. With circular and elliptical shapes or perimeters, light entering input surface 102 is redirected to form a ring of output light.

The above embodiments represent only some of a wide variety of possible extractor shapes and constructions. Regardless of which shape or construction is chosen, it is desirable from a manufacturing standpoint to fabricate the extractors in the form of an array. The array permits convenient manipulation and processing of a large number of the small extractors simultaneously, e.g., where it is desired to polish a surface of the extractors for better coupling to LED dies. The extractors in the array can also be designed with an arrangement and spacing selected to substantially match the arrangement and spacing of an array of LEDs, so that the extractor array can be aligned with and joined to the LED array to produce a large number, preferably tens or hundreds, of LED/extractor pairs simultaneously.

Figure 10:
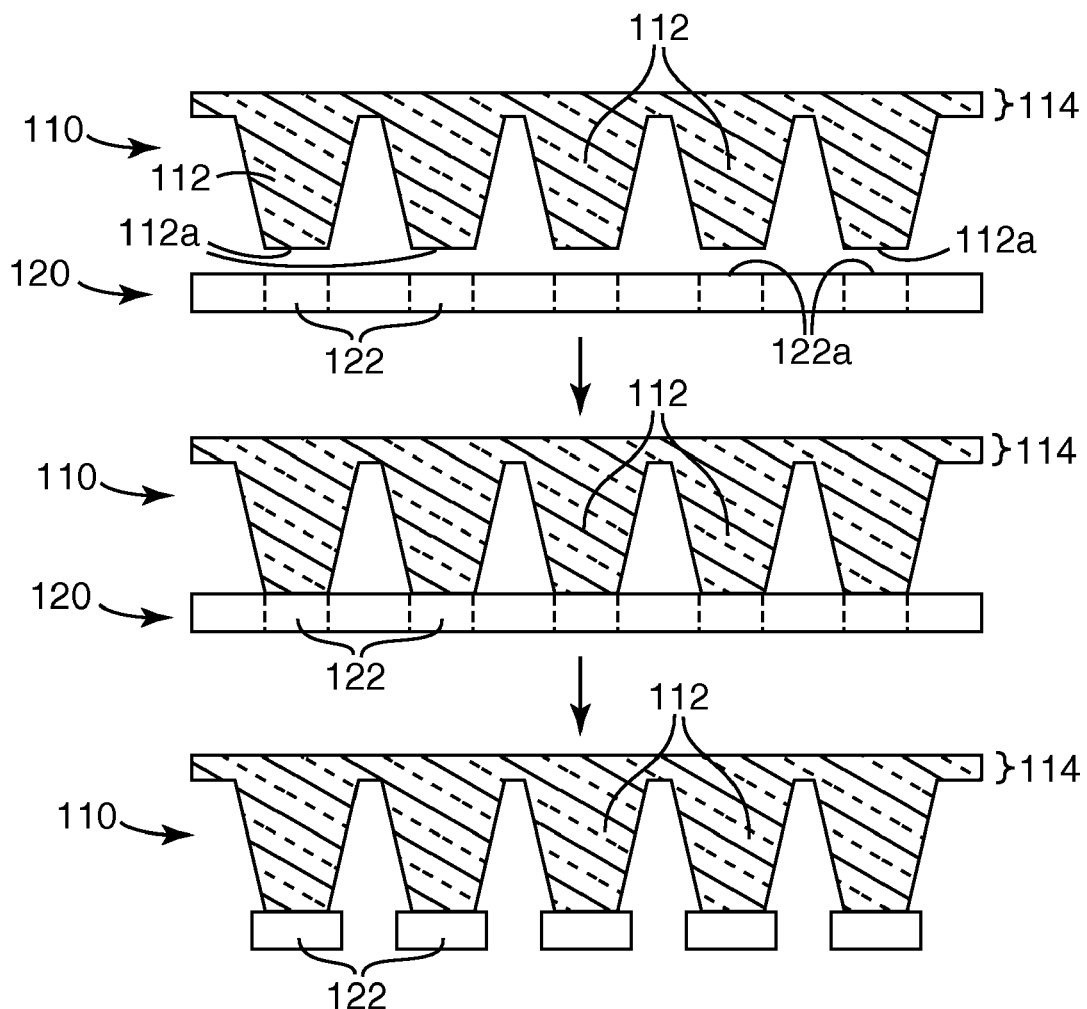
FIG. 10 is a schematic view of an extractor array and a wafer in which LEDs have been formed, the figure also showing a process of simultaneously coupling an array of extractors to an array of LEDs to produce a plurality or array of LED light sources.

FIG. 10 schematically illustrates a representative extractor array 110 and matching LED array 120. Extractor array 110 includes a plurality of extractors 112 that are held together in a fixed spatial relationship, such as with a continuous land layer 114. The fixed spatial arrangement is selected to match the spatial arrangement of LEDs on the LED array 120, discussed below. The extractors array 110 can be a unitary body, wherein extractors 112 and land layer 114 are composed of the same light transmissive material, or it can be non-unitary, where the land layer 114 is composed of a different material (whether light-transmissive or not) than the extractors 112. Furthermore, the extractors 112 themselves may have a compound construction as discussed above. The extractors 112 are shown as tapered shapes similar to extractor 10 of FIG. 1, but they can also represent any of the other extractor shapes and constructions mentioned above. Significantly, the extractors each have an input surface 112a that is adapted to optically couple to an output surface of a corresponding LED die. This is preferably accomplished by ensuring the outer dimensions of the extractor input surface are substantially matched to those of the LED emitting surface, and/or by ensuring the contour of the extractor input surface substantially matches the contour of LED emitting surface. Normally the LED emitting surface is flat and smooth within a specified tolerance, and in that case the extractor input surface is also flat and smooth to the same or similar tolerance.

Some methods of making extractor arrays for LEDs are disclosed in commonly assigned U.S. application Ser. No. 10/977,239 (Ouderkirk et al.), filed Oct. 29, 2004, and Ser. No. 11/288,071 (Leatherdale et al.), filed Nov. 22, 2005. Alternatively, where the array comprises the high refractive index glass materials described below, the array is preferably made at least in part by deforming particles of the glass, and optionally coalescing individual glass particles to form larger particles or bodies, in a suitable mold with the application of heat and pressure. Such molding techniques are disclosed in commonly assigned U.S. Application entitled "Methods of Making LED Extractor Arrays", filed on even date herewith.

LED array 120 is preferably a solid state wafer that has been fabricated using conventional semiconductor processing procedures to form p-n junctions or the like capable of producing light, such that upon singulation (e.g. by sawing or dicing) individual LED dies 122 having emitting surfaces 122a can be formed. Thus, as discussed above, LED array can include a stack of distinct layers selected for the batch fabrication of LEDs, such as a ceramic or semiconductor substrate, superstrate, epitaxial layers, and/or doped layers. Patterned electrical contacts used to energize the individual LEDs may also be included on the array 120. The LED array 120 can also be referred to as a "wafer", since it is typically thin and relatively rigid, and usually round. The dies 122 can be arranged in any desired fashion over the surface of the wafer, e.g. in an arrangement of rows and columns. Tens or hundreds of individual dies 122 may fit within the area of the wafer. The same number of extractors 112 are therefore preferably provided on extractor array 110.

In the method depicted in FIG. 10, the initially separate arrays 110, 120 are aligned with each other, preferably to provide a one-to-one correspondence of extractors to LED dies. The separate aligned arrays are then joined together, optionally with a suitable light-transmissive bonding material such as an optical adhesive or low $T_g$ sealing glass, or via reaction bonding, or by any other suitable technique. If desired, the wafer or array 120 can then be singulated e.g. by cutting or dicing to reveal the individual LED dies 122. Depending on the intended application, the extractor array 120 can also be singulated so that individual LED die/extractor pairs can be individually mounted on a heat sink or other substrate as desired. Singulation can be by cutting through or breaking the land layer 114, the upper surface of which may become the output surface of the extractors 112. If singulation is accomplished by cutting, the same cutting operation that cuts the LED array 120 can simultaneously cut the extractor array 110 if the extractors are appropriately sized. In an alternative approach, the land layer may simply be removed, e.g. by detachment of the extractors from the land layer if different materials are used for each. Removal of the land layer then exposes an upper surface of the extractors 112, which surface may become the output surface of each extractor depending on its design. In still another approach, the extractor array can be bonded to the LED array with the land layer 114 down, i.e., by rearranging the extractor array and LED array so that the LED emitting surfaces contact the land layer 114 while being aligned with the extractors 112. In that case, the surfaces 112a may become output surfaces and the exposed major surface of the land layer may become the input surface of the extractors.

High Refractive Index Glasses

As mentioned above, in order to enhance the efficiency of the LED light sources, the disclosed extractors are desirably composed of a selected class of glass or glass-ceramic materials whose refractive index is at least 2, preferably at least 2.1, 2.2, or 2.3 or more. High refractive index crystalline materials (such as silicon carbide or diamond) have been proposed for use as LED extractors, but such materials are incompatible with molding techniques, and procedures for fabricating such materials into small parts such as extractors tend to be tedious, time consuming, and expensive. Some conventional glass materials available from optical glass manufacturers have also been proposed, but the refractive index of such materials, though higher than typical LED encapsulating resins, is generally below 2.

Some high refractive index glasses (e.g. $n \geq 2$) based for instance on $TiO_2$, $Nb_2O_5$, and $Ta_2O_5$ are known. See, for example, U.S. Pat. No. 3,946,130 (Tung), and Topol L. E. et al, "Formation of new oxide glasses by laser spin melting and free fall cooling", J. Non-Crystal. Solids, 12 (1973), 377-390. These glasses may contain less than 20% $SiO_2$, 20% $B_2O_3$, and 40% $P_2O_5$ by weight. However, until recently, such glasses were only known in the form of microbeads, flakes, and other microparticles, i.e. with severely restricted sizes. Such dimensional limitations made these glasses unsuitable for use as LED extractors, which, though small, are typically not microscopic, and typically have at least one dimension on the order of a few (e.g., from 1 to 10, or 1 to 5, or 1 to 3, or 1 to 2) millimeters. Surprisingly, it was found that preparation of bulk glass based for example on $TiO_2$ was possible, enabling formation of large, millimeter and above sized glass articles. This was achieved through a particle consolidation step performed at temperatures above the glass transition temperature. It was found that these glasses can undergo glass transition ($T_g$) before significant crystallization occurs ($T_x$). This allows bulk fabrication of articles of any dimensions from relatively small pieces of glass. For example, an article was fabricated by heating glass or glass-containing particles (including beads, microspheres, fibers, and powder, obtained, for example, by crushing) above the $T_g$ such that the glass or glass-containing particles, etc. coalesce to form the desired shape and cooling the coalesced shape to provide the article.

In some cases, the heating is conducted at least one temperature in the range from about 500° C. to about 1000° C.

Besides $TiO_2$—, $Nb_2O_5$— and $Ta_2O_5$— based glasses, many $Al_2O_3$— based bulk glasses have been obtained by the above consolidation method. $Al_2O_3$ can impart high mechanical and chemical durability suitable for many non-optical uses such as metal-cutting tools, dental restoratives, etc. At the same time, the relatively low refractive index of $Al_2O_3$ (about 1.7) makes formation of glasses with refractive index of 2 and above impractical.

The present application identifies a class of glass (including glass-ceramic) materials capable of exhibiting a refractive index of at least 2, and suitable for use as LED extractors. Since the materials are at least initially glasses, they can be molded or otherwise deformed or coalesced in a relatively simple and rapid procedure to form precisely shaped extractors, including arrays of extractors. The crystallization temperature $T_x$ of these materials is preferably at least 5° C. above their glass transition temperature $T_g$, to provide an adequate processing window at which to mold, deform, or coalesce particles of the materials.

Some of these preferred glasses have been disclosed in printed publications or other documents for use in other applications, but such documents do not disclose that the glasses can exhibit refractive indices as high as 2 and above, nor that they can be used to make extractors for LEDs. The documents actually disclose a larger class of glasses (referred to herein as "unconventional glasses") that comprise small amounts of conventional glass formers, and we have found that some of these glasses exhibit unusually high refractive indices and are suitable for use as LED extractors. The unconventional glasses comprise, for example, less than 20 (or 15, 10, 5, 3, 2, or 1) percent by weight $SiO_2$, less than 20 (or 15, 10, 5, 3, 2, or 1) percent by weight $B_2O_3$, and less than 40 (or 30, 20, 10, 5, 3, 2, or 1) percent by weight $P_2O_5$. In some cases the unconventional glasses include less than 20 (or 10, 8, 5, 3, 2, or 1) percent by weight of the entire group of compounds $As_2O_3$, $Bi_2O_3$, $GeO_2$, NaO, $TeO_2$, $V_2O_5$, $SiO_2$, $B_2O_3$, and $P_2O_5$, based on the total weight of the glass body perform. Instead of large amounts of these conventional glass formers, the unconventional glasses comprise at least two different metal oxides as explained further below. Preferably, $T_g$ and $T_x$ are separated by at least 5° C., i.e., $T_x \geq T_g + 5°$ C.

The at least two metal oxides used in the unconventional glasses (and therefore also potentially in the preferred high refractive index glasses) may include, for example, $Al_2O_3$; $TiO_2$; rare earth oxides (REOs) such as $CeO_2$, $Dy_2O_3$, $Er_2O_3$, $Eu_2O_3$, $Gd_2O_3$, $Ho_2O_3$, $La_2O_3$, $Lu_2O_3$, $Nd_2O_3$, $Pr_6O_{11}$, $Sm_2O_3$, $Tb_2O_3$, $Th_4O_7$, $Tm_2O_3$ and $Yb_2O_3$; $ZrO2$, $HfO_2$, $Ta_2O_5$, $Nb_2O_5$, $Bi_2O_3$, $WO_3$, $V_2O_5$, $Ga_2O_3$, and alkaline earth metal oxides such as CaO and BaO. Exemplary combinations of useful metal oxides include REO—$TiO_2$, REO—$ZrO_2$—$TiO_2$, REO—$Nb_2O_5$, REO—$Ta_2O_5$, REO—$Nb_2O_5$—$ZrO_2$, REO—$Ta_2O_5$—$ZrO_2$, CaO—$Nb_2O_5$, CaO—$Ta_2O_5$, BaO—$TiO_2$, REO—$Al_2O_3$, REO—$Al_2O_3$—$ZrO_2$, REO—$Al_2O_3$—$ZrO_2$—$SiO_2$, and SrO—$Al_2O_3$—$ZrO_2$. Useful glass formulations include those at or near a eutectic composition.

For further discussion and teachings regarding such unconventional glasses, reference is made to: U.S. Patent Publication US 2003/0126803 (Rosenflanz); PCT Publication WO 03/011776 (Rosenflanz); U.S. Patent Publication US 2005/0065013; U.S. application Ser. No. 11/273,513, filed Nov. 14, 2005. Reference is also made to: U.S. Pat. No. 2,150,694 (Morey); Topol et al., "Formation of new oxide glasses by laser spin melting and free fall cooling", J. Non-Crystal. Solids, 12 (1973), 377-390; Topol, "Formation of new lanthanide oxide glasses by laser spin melting and free-fall cooling", J. Non-Crystall.Solids, 15 (1974), 116-124; Shishido et al., "Ln—M—O glasses obtained by rapid quenching using laser beam", J. Mater. Sci., 13 (1978), 1006-1014; Tatsumisago, "Infrared Spectra of Rapidly Quenched Glasses in the Systems, Li2O—RO—Nb2O5 (R=Ba, Ca, Mg)", J. American Ceram. Soc., 66 Vol. 2, (1983), 117-119.

The preferred glass compositions contain relatively lower amounts of typical glass-formers, such as $SiO_2$ and $B_2O_3$, than conventional glass. The compositional control of the process window between $T_g$ and $T_x$ (at least 5° C.) allows for bulk preparation of glasses and glass-ceramics with refractive indices of about 2.0 or greater in non-conventional glass-forming oxide systems.

In general, the preferred glasses (including glass-ceramics) can be made by heating the appropriate metal oxide sources to form a melt, desirably a homogenous melt, and then cooling the melt to provide glass. Some embodiments of glass materials can be made, for example, by melting the metal oxide sources in any suitable furnace (e.g., an inductive heated furnace, a gas-fired furnace, or an electrical furnace), or, for example, in a flame or plasma. The resulting melt is cooled by discharging the melt into any of a number of types of cooling media such as high velocity air jets, liquids, graphite or metal plates (including chilled plates), metal rolls (including chilled metal rolls), metal balls (including chilled metal balls), and the like.

In one method, the preferred glasses can be made utilizing flame fusion as disclosed, for example, in U.S. Pat. No. 6,254,981 (Castle). Briefly, the metal oxide source materials are formed into particles sometimes referred to as "feed particles". Feed particles are typically formed by grinding, agglomerating (e.g., spray-drying), melting, or sintering the metal oxide sources. The size of the feed particles fed into the flame generally determines the size of the resulting amorphous particle material. The feed particles are fed directly into a burner such as a methane-air burner, an acetylene-oxygen burner, a hydrogen-oxygen burner, and like. The materials are subsequently quenched in, for example, water, cooling oil, air, or the like.

Other techniques for forming melts, cooling/quenching melts, and/or otherwise forming glass include vapor phase quenching, plasma spraying, melt-extraction, gas or centrifugal atomization, thermal (including flame or laser or plasma-assisted) pyrolysis of suitable precursors, physical vapor synthesis (PVS) of metal precursors, plasma method and mechanochemical processing.

The cooling rate is believed to affect the properties of the quenched amorphous material. For instance, glass transition temperature, density and other properties of glass typically change with cooling rates. Rapid cooling may also be conducted under controlled atmospheres, such as a reducing, neutral, or oxidizing environment to maintain and/or influence the desired oxidation states, etc., during cooling. The atmosphere can also influence glass formation by influencing crystallization kinetics from undercooled liquid.

The preferred high index glasses can be formed into extractors via any suitable method. For example, an extractor can be prepared by providing a mold having a bottom surface, a top opening that is larger than the bottom opening, and at least one side surface. A melt can be prepared as described above, e.g., with at least two metal oxides and less than 20% by weight $B_2O_3$, less than 20% by weight $SiO_2$ and less than 40% by weight $P_2O_5$. The melt is cooled to form glass bodies (e.g. sphere, microsphere, fiber, irregularly shaped particle, etc.). The glass bodies will have a $T_g$ and $T_x$, where $T_x$ is at least 5° C. greater than $T_g$.

The glass bodies are placed into the mold and between about 0.1 MPa and about 100 MPa of pressure is applied at about 500° C. and about 1000° C. for between about 1 s and about 100 min to completely fill the mold with glass. Once the extractor is formed, it is removed from the mold. Arrays of such extractors can also be formed in the mold by providing an array of cavities and a land layer that connects the extractors.

Alternatively, the melt, prepared as described above, can be directly cooled into an extractor within an extractor-shaped mold and subsequently removed from the mold. This method maybe conducted as described in U.S. Application Publication US 2004/0148967 (Celikkaya et al.). It is also possible to directly cool the melt into a transparent crystalline extractor, provided the same material when made into glass exhibits $T_g$ and $T_x$ and the difference between $T_g$ and $T_x$ is at least 5° C., so that consolidation into bulk glass bodies can be obtained.

In other cases, the melt as prepared above can be cooled into glass bodies (e.g. plates, rods, bars, etc), and the glass bodies are subsequently machined or abraded into extractors. Precision abrasive techniques for forming or finishing extractors are disclosed in the following commonly assigned U.S. patent applications: application Ser. No. 10/977,239 entitled "Process for Manufacturing Optical and Semiconductor Elements", filed Oct. 29, 2004; application Ser. No. 10/977,240 entitled "Process for Manufacturing a Light Emitting Array", filed Oct. 29, 2004; and application Ser. No. 11/288,071 entitled "Arrays of Optical Elements and Method of Manufacturing Same", filed Nov. 22, 2005.

The preferred high index glasses can also be heat-treated to at least partially crystallize the glass to provide glass-ceramic. The heat-treatment of glasses to form glass-ceramics is known in the art, and the heating conditions to nucleate and grow glass-ceramics are known for a variety of glasses. Heat-treatment can be carried out by any of a number of ways including, for example, resistive, inductive, or gas heated furnaces. Alternatively, heat treatment can be conducted continuously using a rotary kiln, fluidized bed furnace or pendulum kiln. Typically, glass-ceramics have higher refractive index than the glasses from which they are formed and therefore may be beneficial in the disclosed extractor applications. Furthermore, the refractive index of the material may be adjusted, for example, by the degree to which the glass is converted to crystalline glass-ceramic phase(s). Alternatively, or in addition, the strength of the material may also be affected by such crystallization treatment.

Table Exemplifying High Refractive Index Glasses Suitable for Fabrication as Extractors Samples of a variety of unconventional glasses capable of forming or shaping into bodies such as extractors were made or otherwise obtained, and the refractive index was measured. Other properties related to their suitability as LED extractors were also noted.

The results are provided in the table shown in FIGS. 11A-B. The table lists a total of 56 glass samples, each having a unique composition. Glass samples 1 through 52 and their method of manufacture have been described in one of the printed publications or patent applications referenced above, as identified in the second and third columns of the table. (The glass samples 53 through 56 were made with similar processes but different compositions.) The next ten columns show the composition of each glass sample in terms of the weight percent of the indicated metal oxides. The next two columns show the glass transition temperature $T_g$ and crystallization temperature $T_x$ of the glass samples. Some glass samples have no values listed for these parameters because they were not recorded or carefully measured. However, for each of the 56 glass samples listed, the crystallization temperature $T_x$ is at least 5° C. greater than the glass transition temperature $T_g$. The next column, labeled "n1", is the refractive index of the glass composition after flame-forming. The last (right-most) column, labeled "n2", is the refractive index of the glass composition after heat treatment, i.e., after conversion to a glass-ceramic. A null value in this column indicates heat treatment was not performed on the particular sample. The refractive indices n1 and n2 were measured at a visible wavelength between 500 and 600 nm, according to the procedure described in T. Yamaguchi, "Refractive Index Measurement of High Refractive Index Beads," Applied Optics Volume 14, Number 5, pages 1111-1115 (1975).

Review of the table confirms that only some of the unconventional glasses are capable of achieving a refractive index of 2 or more. These glass samples (numbers 14, 16-17, 19-25, and 27-56) are shaded in the first column. Most of these (glass samples 16-17, 19-25, and 27-56) are capable of achieving a refractive index of 2.1 or more. Fewer (glass samples 16-17, 22, 24-25, 27-28, and 31-53) are capable of achieving a refractive index of 2.2 or more. Glass samples 16-17, 25, and 31-52 can achieve a refractive index of 2.3 or more. Glass samples 31-34, 36, 48, and 50-52 can achieve a refractive index of 2.4 or more.

Analysis of the table shows that as a class of materials, $Al_2O_3$-based glasses exhibit refractive index between 1.75 and 1.95, with higher index compositions (n≧2) typically including elevated levels of such components as $ZrO_2$, $TiO_2$, $Nb_2O_5$, $T_2O_5$, and REO.

Another class of glasses included in the table makes use of $Nb_2O_5$ or $Ta_2O_5$ as the major glass-forming components. Both of these oxides are high refractive index materials (2.2 to 2.4) and therefore are useful for the extractor applications. Glass samples prepared with these oxides exhibit refractive indices from about 2.1 to 2.35.

Yet another class of glasses included in the table is based on $TiO_2$. $TiO_2$ is a known high refractive index material that in some cases can exhibit refractive index as high as 2.9 (for rutile crystalline phase). Many of the glasses described in the table incorporate high amounts of $TiO_2$, showing exceptionally high refractive index (from about 2.25 to 2.4).

Additionally, both REO (e.g $La_2O_3$) and $ZrO_2$ are useful as refractive index raising components. Glasses that utilize elevated levels of REO in some cases can show an index above 2. However, poor hydrolytic stability of REO (e.g. $La_2O_3$) may adversely affect the overall utility of such glass as an extractor element.

$ZrO_2$ by itself is a poor glass-former, precluding formation of glasses based primarily on it. However, in many cases the addition of $ZrO_2$ can lower the melting point (i.e. result in higher order eutectic formation) of the material and significantly improve the ability to form glass. Also, as evident from the data in the table, the addition of $ZrO_2$ to all classes of the above-mentioned glasses (e.g. $Al_2O_3$, $Nb_2O_5$, $Ta_2O_5$ and $TiO_2$) is particularly useful to help increase the refractive index.

In summary, we have shown how glasses can be made with suitable compositions to provide glass extractors and extractor arrays suitable for use with LEDs, the extractors having high refractive indices of at least 2, 2.1, 2.2, 2.3, or 2.4.

Unless otherwise indicated, all numbers expressing feature sizes, amounts, and physical properties used in the specification and claims are to be understood as being modified by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The foregoing description is illustrative and is not intended to limit the scope of the invention. Variations and modifications of the embodiments disclosed herein are possible, and practical alternatives to and equivalents of the various elements of the embodiments would be understood to those of ordinary skill in the art upon study of this patent document. These and other variations and modifications of the embodiments disclosed herein may be made without departing from the spirit and scope of the invention. All patents and patent applications referred to herein are incorporated by reference in their entireties, except to the extent they are contradictory to the foregoing specification.

The invention claimed is:

1. An extractor suitable for use with an LED die, comprising:
   an input surface adapted to optically couple to an emitting surface of an LED die; and
   an output surface positioned to emit light entering the optical element through the input surface;
   wherein the extractor includes an optical glass whose refractive index is at least 2.0,
   wherein the optical glass has a glass transition temperature of at least about 800° C. and includes at least two metal oxides and less than 20% by weight $B_2O_3$, less than 20% by weight $SiO_2$, and less than 40% by weight $P_2O_5$.

2. The extractor of claim 1, wherein the refractive index of the optical glass is at least 2.2 at a wavelength of light emitted by the LED die.

3. The extractor of claim 1, wherein the extractor is one of an array of extractors held together in a fixed spatial relationship.

4. The extractor of claim 1, wherein the array of extractors includes a land layer suitable for holding the extractors in the fixed spatial relationship.

5. The extractor of claim 1 in combination with the LED die having the emitting surface.

6. The extractor of claim 5, wherein the LED die is one of an array of LED dies held together in a fixed spatial relationship, and the extractor is one of an array of extractors held together in substantially the same fixed spatial relationship.

7. The extractor of claim 6, wherein the array of extractors is bonded to the array of LED dies.

8. The extractor of claim 1, wherein the optical glass includes less than 20% by weight of the group of $B_2O_3$, $SiO_2$, and $P_2O_5$.

9. The extractor of claim 1, wherein one of the metal oxides is a rare earth oxide or an alkaline earth oxide.

10. The extractor of claim 1, wherein one of the metal oxides is $Al_2O_3$ $TiO_2$, $Nb_2O_5$, or $Ta_2O_5$.

11. The extractor of claim 1, wherein the optical glass has a glass transition temperature $T_g$ and a crystallization temperature $T_x$, and wherein $T_x$ is at least 5° C. greater than $T_g$.

12. The extractor of claim 1, wherein the extractor comprises at least two distinct optical bodies, wherein a first optical body comprises the optical glass and a second optical body comprises a second optical material.

13. The extractor of claim 12, wherein the second optical material is a second optical glass having a refractive index lower than that of the first-mentioned optical glass.

14. The extractor of claim 12, wherein the optical glass is disposed at the input surface of the extractor.

15. The extractor of claim 1, wherein the optical glass is a glass-ceramic material.

16. The extractor of claim 1, wherein the input surface has a surface roughness of less than 50 nanometers (nm).

17. The extractor of claim 1, wherein the optical glass comprises at least two metal oxides, at least one of the two metal oxides comprising $Al_2O_3$, $TiO_2$, $CeO_2$, $Dy_2O_3$, $Er_2O_3$, $Eu_2O_3$, $Gd_2O_3$, $Ho_2O_3$, $La_2O_3$, $Lu_2O_3$, $Nd_2O_3$, $Pr_6O_{11}$, $Sm_2O_3$, $Tb_2O_3$, $Th_4O_7$, $Tm_2O_3$, $Yb_2O_3$, $ZrO2$, $HfO_2$, $Ta_2O_5$, $Nb_2O_5$, $Bi_2O_3$, $WO_3$, $V_2O_5$, $Ga_2O_3$, $CaO$, or $BaO$.

18. The extractor of claim 1, wherein the optical glass comprises at least two metal oxides, the at least two metal oxides comprising combinations of REO—$TiO_2$, REO—$ZrO_2$—$TiO_2$, REO—$Nb_2O_5$, REO—$Ta_2O_5$, REO—$Nb_2O_5$—$ZrO_2$, REO—$Ta_2O_5$—$ZrO_2$, CaO—$Nb_2O_5$, CaO—$Ta_2O_5$, BaO—$TiO_2$, REO—$Al_2O_3$, REO—$Al_2O_3$—$ZrO_2$, REO—$Al_2O_3$—$ZrO_2$—$SiO_2$, or SrO—$Al_2O_3$—$ZrO_2$, wherein REO is a rare earth oxide.

19. The extractor of claim 1, wherein the optical glass comprises at least two metal oxides, the at least two metal oxides comprising REO—$ZrO_2$—$TiO_2$ or REO—$Nb_2O_5$—$ZrO_2$, wherein REO is a rare earth oxide.

* * * * *

UNITED STATES PATENT AND TRADEMARK OFFICE
CERTIFICATE OF CORRECTION

PATENT NO. : 7,423,297 B2
APPLICATION NO. : 11/381518
DATED : September 9, 2008
INVENTOR(S) : Catherine A. Leatherdale It is certified that error appears in the above-identified patent and that said Letters Patent is hereby corrected as shown below:

Title Page, Column 2, "Other Publications,"
Line 2, delete "Al2O3" and insert -- $Al_2O_3$ --, therefor.

Title Second Page, Column 2, "Other Publications,"
Line 16, delete "Al2O3" and insert -- $Al_2O_3$ --, therefor.
Line 36, delete "Al2O3," and insert -- $Al_2O_3$, --, therefor.

Column 2,
Line 36, delete ")" and insert -- . --, therefor.

Column 9,
Line 40, after "Application" insert -- Ser. No. 11/381,512, --, therefor.

Column 11,
Line 49, delete "ZrO2," and insert -- $ZrO_2$, --, therefor.

Column 12,
Line 5, delete "Li2O--RO--Nb2O5" and insert -- $Li_2O$—$RO$—$Nb_2O_5$, --, therefor.
Line 5, delete "R==Ba," and insert -- R=Ba, --, therefor.

Column 14,
Line 30, delete "$T_2O_5$," and insert -- $Ta_2O_5$, --, therefor.

UNITED STATES PATENT AND TRADEMARK OFFICE
CERTIFICATE OF CORRECTION

PATENT NO. : 7,423,297 B2
APPLICATION NO. : 11/381518
DATED : September 9, 2008
INVENTOR(S) : Catherine A. Leatherdale It is certified that error appears in the above-identified patent and that said Letters Patent is hereby corrected as shown below:

Column 16,
Line 9, Claim 10, after "$Al_2O_3$" insert -- , --.
Line 30, Claim 17, delete "$Th_{4O7}$," and insert -- $Th_4O_7$, --, therefor.
Line 30, Claim 17, delete "ZrO2," and insert -- $ZrO_2$, --, therefor.

Signed and Sealed this

Twenty-seventh Day of January, 2009

JOHN DOLL
*Acting Director of the United States Patent and Trademark Office*